United States Patent [19]

Danielmeyer

[11] Patent Number: 5,128,955
[45] Date of Patent: Jul. 7, 1992

[54] METHOD FOR THE OPERATION OF A LIGHT AMPLIFIER HAVING ARCUATELY OR, RESPECTIVELY, ANNULARLY GUIDED RADIATION, PARTICULARLY A RING LASER DIODE

[75] Inventor: Guenter Danielmeyer, Munich, Fed. Rep. of Germany

[73] Assignee: Siemens Aktiengesellschaft, Berlin and Munich, Fed. Rep. of Germany

[21] Appl. No.: 466,263

[22] PCT Filed: Aug. 18, 1988

[86] PCT No.: PCT/DE88/00508
§ 371 Date: Feb. 16, 1990
§ 102(e) Date: Feb. 16, 1990

[87] PCT Pub. No.: WO89/01712
PCT Pub. Date: Feb. 23, 1989

[30] Foreign Application Priority Data

Aug. 18, 1987 [DE] Fed. Rep. of Germany ....... 3727546

[51] Int. Cl.$^5$ .................................. H01S 3/083
[52] U.S. Cl. ........................ 372/94; 372/44; 372/45
[58] Field of Search .................. 372/44, 45, 46, 50, 372/93, 94

[56] References Cited

U.S. PATENT DOCUMENTS

| | | | |
|---|---|---|---|
| 3,743,962 | 7/1973 | Rosenberg | 372/7 |
| 3,849,746 | 11/1974 | Brandt | 372/7 |
| 4,626,075 | 12/1986 | Chelma | 350/354 |
| 4,694,459 | 9/1987 | Burnham et al. | 372/45 |
| 4,792,962 | 12/1988 | Miyauchi et al. | 372/94 |
| 4,815,084 | 3/1989 | Scifres et al. | 372/46 |

OTHER PUBLICATIONS

Appl. Phys. Lett. Band 29(8) Oct. 15, 1976, D. Botez et al., "Optically pumped GaAs-GaAl-xAlxAs half-ring . . .".

N. Matsumoto, Rev. Electric Comm. Lab., 26(7/8), p. 502. "Bent guide structure . . . ", Jul./Sep. 1978.

Appl. Phys. Lett. 36(10), May 1980, p. 801, A. S-H. Liao et al., "Semiconductor injection lasers . . . ".

Primary Examiner—Georgia Y. Epps
Attorney, Agent, or Firm—Hill, Van Santen, Steadman & Simpson

[57] ABSTRACT

A light amplifier or ring laser having an arc-shaped phase-guided beam path which is free of Tscherenkov radiation is provided. A gradient of the refractive index proportionate to the inverse change in radius of the laser radiation is ensured by the choice of the pumping level in a given path during pumping of the laser-generating material.

10 Claims, 4 Drawing Sheets

METHOD FOR THE OPERATION OF A LIGHT AMPLIFIER HAVING ARCUATELY OR, RESPECTIVELY, ANNULARLY GUIDED RADIATION, PARTICULARLY A RING LASER DIODE

BACKGROUND OF THE INVENTION

1. Field of the Invention

The present invention is directed to a light amplifier, particularly to a ring laser diode.

2. Description of the Related Art (Unpumped) annular optical waveguides or, respectively, optical ring oscillators are known from the prior art (JP published application 59-154086 and Appl. Phys. Lett. 47 (1985) Pages 439–440). Ring lasers to be optically pumped are described in Appl. Phys. Lett. 29 (1976) Pages 502–504 and 43 (1983) Pages 32–34. There is particular interest in annular laser arrangements to be pumped by current injection, what are referred to as ring laser diodes, whereby this principle of effecting the population inversion needed for the stimulated emission by current passage through a pn-junction of a semiconductor member is already disclosed by Heywang, DE-AS 12 98 216.

Ring laser diodes are disclosed by Jap. J. Appl. Phys. 16 (1977) Pages 2281–2282, 16 (1977) Pages 1395–1398; Appl. Phys. Lett. 36 (1980) Pages 801–803, 36 (1980) pages 353–355; Jour. Appl. Phys. 52 (1981) pages 4457–4461; Japanese published applications 58-118183 and 60-148185. These are ring laser diodes wherein the semiconductor material or, respectively, the semiconductor member is prepared such along or, respectively, in the region of such an annular zone. The aim of such preparations is to create an annularly fashioned index guidance as is known in equivalent fashion for straight-line index guidance of laser emission in laser diodes. For the sake of completeness, let it be pointed out here that the principle of gain guidance also exists for laser diodes having straight-line radiation propagation, whereby the necessary laser condition for this zone is created to a critical degree by topically concentrated current density distribution in a straight-line or, respectively, in an annular zone.

The preparation of a semiconductor member for the purpose of creating a ring laser diode is involved. This is probably one reason why ring laser diodes, insofar as known, have not been practically employed up to now, even though ring lasers advantageously do not require mirrors or surfaces having at least a certain reflectivity as are required for laser diodes having straight-line propagation of the laser emission.

SUMMARY OF THE INVENTION

It is an object of the present invention to specify an operation for such a light amplifier, particularly a ring laser diode, that can be manufactured in a technologically simpler way, particularly with at most a relatively slight adjustment outlay and that can be advantageously fashioned or, respectively, used as a multiplexer/demultiplexer. This object is achieved in a method for the operation of a light amplifier having an arcuately or annularly guided radiation path in a laser active material of the light amplifier, having a width (B) of an arcuate or annular pump zone provided on a surface of the laser active material that develops a pumped laser energy at a depth (D) in the laser active material, the pumped laser energy having a distribution profile with reference to a radiation path of mean radius ($R_0$), and a gradient of the distribution profile of the pumped laser energy effecting a gradient of the refractive index (n) of the laser active material dependent thereon, and a maximum gain ($g_{max}$) lying at a center radiation frequency ($f_0$), the method of operation being characterized by generating a phase guided laser radiation having a frequency $f_{1,2}=f_0\pm\Delta f$, the phase guided radiation having a gain less than the maximum gain depending upon the width of the pump zone and the depth in the material of the laser energy, and allowing the phase guided radiation to circulate in a radius region ($R_0\pm\Delta R$) which is established for the center radiation frequency in which a refractive index $n(R)=n_0\pm\Delta n$ is modified by the pumped laser energy to provide a refractive index curve approximated to the negative inverse of the radius of the radiation path ($-1/R$) so that radiation analogous to Tscherenkow radiation is avoided on the radiation path.

The method of operation of the light amplifier further includes optical pumping of the laser active material along an arcuate radiation stripe. The operation of the light amplifier may include providing two at least arcuately shaped irradiation regions on the surface of the laser active material. These two at least arcuately shaped regions may be two coaxially place ring shaped regions.

Current injection into the semiconductor material may be used along an electrode strip, whereby the laser energy is controlled by the injection current. The annular or arcuate radiation path is preferably held to a locally constant radius during the operation of the present laser. In one embodiment, the method of operation includes providing two coaxially arranged annular or at least arcuate electrodes for separate current supply. In another preferred embodiment, a toothed injection electrode is provided.

The present light amplifier is preferably provided with an integrated semiconductor structure for operation of the light amplifier, including control, modulation and/or evaluation electronics.

The light amplifier operated according to the present method may be used a multiplexer and/or a demultiplexer. The principles embodied in the present invention may be used for control of the path direction and-/or as a separating filter for the path direction.

One basis of the present invention is to employ a principle of a phase guidance of the optical radiation that has hitherto not been employed for annular and, namely, loss-free beam guidance and that is particularly suited for a ring laser diode.

Optical radiation propagating itself (at least essentially) as a parallel beam (in an isotropic medium) has planar wave fronts with a constant phase. Given a straight radiation direction, these wave fronts are aligned parallel to one another. When, however, such a radiation proceeds along an arc, then the planar wave fronts continue to be perpendicular to the beam direction, i.e. perpendicular to the tangent respectively adjacent at the arc. This, however, means that the wave fronts are no longer aligned parallel to one another along such an arc. There is thus a different phase velocity over the cross-section of such a bent beam. The phase velocity at the outside of the arc is greater than in the center of this beam.

When the refractive index of the medium in which the radiation propagation ensues, is constant over the cross-section of the beam or, respectively, over the respective plane, this leads thereto that the phase velocity in the outer regions of the arc exceeds the phase propagation speed valid for the medium and energy emission analogous to classical (Tscherenkow Radiation) toward the outside occurs.

This radiation loss can be avoided when care is exercised to see that the phase velocity in outer parts of the beam cross-section with reference to the arc does not exceed the phase propagation speed of the medium $v_n = v_0/n$ ($v_0$ = speed of light in a vacuum; n = the refractive index that is topically valid for the radiation in the propagation medium). This can be achieved in that a diminished refractive index of the medium is provided in the outside parts of the beam cross-section. The appearance of this "Tscherenkow Radiation" can be prevented for a curvature R of the arc when a decrease in the refractive index according to the function 1:R is provided in the direction of the radius of this curvature:

$$dn(f)/dR = n_0/(R_0 - R) \quad (1)$$

The above equation is the mathematical expression for a course of the refractive index free of emission in radial direction of this arc having the radius R. Light or, respectively, laser emission is guided in a (circular) annular arc along which the distribution of the phase refractive index corresponding to this expression is present without the appearance of a Tscherenkow Radiation. The term "phase guidance" is used for this type of waveguide, whereby a third principle is involved in addition to index guidance and gain guidance that can be employed alone or in combination with index guidance and/or gain guidance (given non-linear waveguide).

When this 1:R condition is satisfied for a complete ring, than a ring resonator that requires no resonator mirror and is free of radiation losses to this extent is present. The radiation propagating along or, respectively, in such a circular ring is fed back onto itself, as is already fundamentally known for other ring lasers.

The following Lorentz equation is known from atom physics for what is referred to as the Lorentz line:

$$n(f) = n_o + \Delta n = n_o + \frac{g \cdot (R) \cdot \lambda}{4\pi \cdot (1 + I/I_o)} \cdot \frac{(f - f_o)/(\Delta f/2)}{1 + (f - f_o)^2/(\Delta f/2)^2} \quad (2)$$

this stating that spectral emission or absorption or, respectively, optical resonant behavior of a material is accompanied by a corresponding spectral change in refractive index $n_0 \pm \Delta n$ of this material. FIG. 4 in J. Appl. Phys., Vol. 52 (1981) pages 4457-61 (4459) shows such a change.

Denoting in equation (2) are:

$f_0$ the resonant or, respectively, center frequency of the (resonant) line $n_0$ the value of the (dispersive) refractive index not influenced by this resonant effect that, moreover, is also valid for the frequency $f_0$;

f the frequency for which the value $n_0 + \Delta n$ is valid ($\Delta n$ can also be negative);

$\Delta f$ the half-value (band) width of the line;

$I/I_0$ an intensity ratio, the ratio of the existing radiation intensity to the saturation intensity in a laser;

$\lambda$ the wavelength of, for example, the generated laser emission;

$g_0$ the gain (or absorption) degree for the center frequency.

The afore-mentioned scientific perceptions form the basis for the following teaching to technical action.

The gain (or absorption) degree g is frequency-dependent within the line and is location-dependent in a laser having local (x, y), non-constant pumps (for example, having locally different power density of the charge carrier injection).

For a ring waveguide or, respectively, ring laser set forth below having the respective, mean ring radius $R_0$, locations outside of this ring are referenced ($R_0 + \Delta R$) and locations inside the ring are referenced ($R_0 - \Delta R$). The location $R_0$ corresponds to the center or maximum of the charge carrier injection or, respectively, of the optical pumping.

DETAILED DESCRIPTION OF THE PREFERRED EMBODIMENTS

Figure 1:
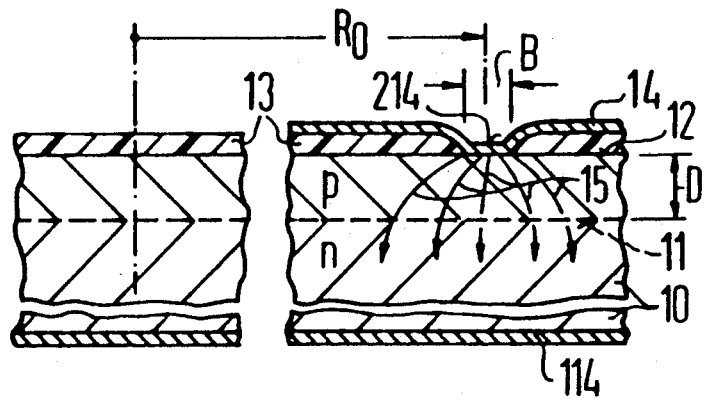
FIG. 1 is a cross section through a semiconductor ring laser according to the principles of the present invention.

FIG. 1 shows the sectional view through a ring laser having a semiconductor body 10 with a pn-junction 11. An insulating layer 13 of, for example, silicon dioxide is provided on the surface 12 of this semiconductor body. The arrow R with $R_0$ indicates the radius of the annular path of this ring laser. 14 references an electrode and 114 references a cooperating electrode on that surface of the semiconductor body 10 lying opposite the surface 12. At the location of the radius $R_0$, the electrode 14 lies on the surface 12 of the semiconductor body 10 as an annular strip 214 having a relatively small width B. An electrical contact to the material of the semiconductor 10 is present in the region of the annular strip 214. An at least largely ohmic, optimally low-impedance metal-to-semiconductor contact is present there. The formation of a metal contact resting on the surface of a semiconductor material only in a prescribed region but isolated therefrom laterally by the insulating layer 13 is well-known for gain-guided laser diodes. It can also be provided instead of an electrical insulation by the insulating layer 13 that the metal-to-semiconductor contact has the property of an optimally far-reaching, inhibiting Schottky contact in this region outside the annular strip 214. Such an embodiment is known, for example, as a MCRW laser diode.

Let the known prior art be referenced in view of the details of the structure of the semiconductor body 10. A double hetero-layer structure is advantageously provided, this also having index-guiding layers that extend parallel to the plane of the pn-junction 11 adjacent above and below said pn-junction 11. These can effect waveguidance in a direction perpendicular to these planes (perpendicular to R).

Figure 2:
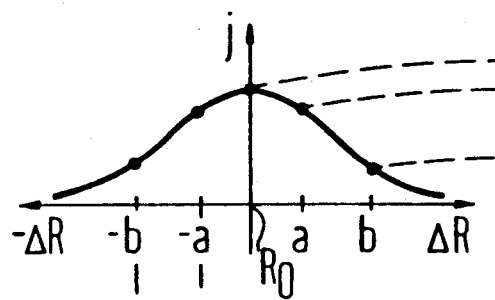
FIG. 2 is a graph of power distribution relative to changes in radius of the laser radiation in the ring laser of FIG. 1.

The power distribution or, respectively, expansion in the semiconductor body 10 indicated by the curved arrows in FIG. 1 is graphically shown in FIG. 2. 15 indicates the current distribution profile j ($\pm \Delta R$), namely as it derives in the region of the critical pn-junction 11 of the semiconductor body 10 given a distance D between this junction 11 and the annular strip 214, whereby a relatively or, respectively, optimally low width B is provided for this annular strip 214. The cooperating electrode 114 is that of FIG. 1. As may be seen, the profile j ($\pm \Delta R$) is dependent on the quantities D and B. Values between 1 and 10 $\mu$m for B and values between 1 and 10 $\mu$m for the depth D are expedient.

As known, the gain of a laser diode pumped with electrical current is dependent on the respective current density. At least in the standard case, the highest gains $g_0$ can be found in the region of the ring $R_0$, namely for the frequency $f_0$ that corresponds to the center frequency of the optical resonator.

Figure 3:
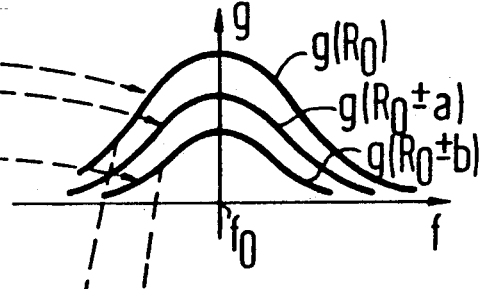
FIG. 3 is a graph of the degree of gain relative to frequency of the laser emission of the ring laser of FIG. 1.

The degree of the gain g is shown in a graphic illustration in FIG. 3 entered over the frequency. The curve referenced g ($R_0$) indicates the gain g present on the ring with $R_0$ that, as shown, drops off to lower and to higher frequencies f outside of the center frequency $f_0$. The corresponding curves for annular paths lying outside the ring $R_0$ are also shown in FIG. 3, namely for the radii ($R_0 \pm a$) and ($R_0 \pm b$). The deviating diameters are identified in FIG. 2 as R = $\pm a$ or, respectively, R = $\pm b$. The current-injected excitation of the current distribution of FIG. 1 is respectively correspondingly smaller on the rings $R_0 \pm a$ and $R_0 \pm b$.

Let it be pointed out here that a similar distribution g (f, R) derives for an optically pumped ring laser. An appropriate intensity distribution of the beamed-in, pumping light that is dependent on the radius R is selected for an annular strip region for this purpose.

Figure 4:
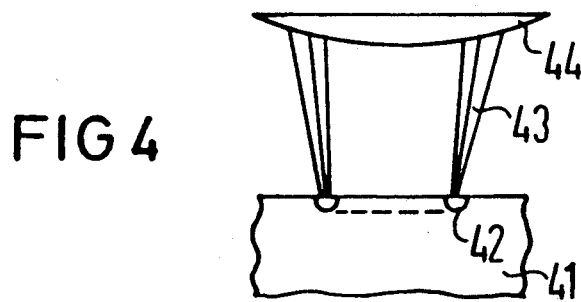
FIG. 4 is a schematic illustration of optical pumping of laser active material by an annular irradiation.

Referenced 41, FIG. 4 shows a body of laser-active material such as, for example, Nd Al$_3$ (BO$_3$)$_4$. 42 references an annular path for the laser emission in this body 41. The optical pumping ensues in the region of this path 42 on the basis of corresponding annular irradiation with focussed pump light 43. 44 references a focussing lens.

Figure 5:
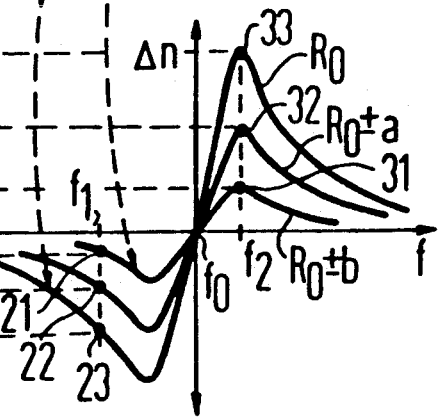
FIG. 5 is a graph of refractive index changes relative to the frequency of the laser radiation of the ring laser of FIG. 1.

FIG. 5 shows a graphic illustration of the dependency of the change in refractive index deriving for the parameters g(R) of FIG. 3, namely of the frequency of generated laser emission. In accord with the parameter values g($R_0$), g ($R_0 \pm a$) and g ($R_0 \pm b$), the curves reproduced in FIG. 5 are obtained. Given the frequency $f_0$, these curves proceed through the value $\Delta n = 0$. Curves having highest values for $\Delta n$ that have minimums and maximums derive outside of this zero point for the ring having the diameter $R_0$. Two frequency values $f_1$ and $f_2$ are emphasized in FIG. 5.

Figure 6:
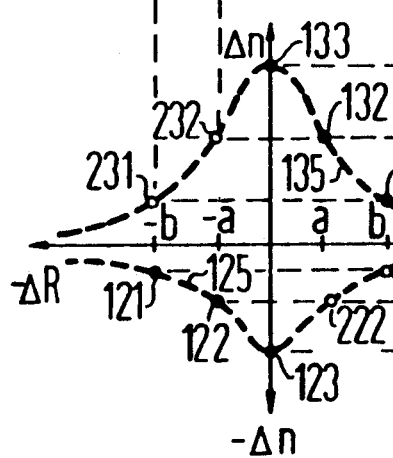
FIG. 6 is a graph of changes in refractive index relative to changes in radius of the ring laser of FIG. 1.

The graphic illustration of FIG. 6 can be derived from FIG. 5, this graphic illustration of FIG. 6 in turn indicating the refractive index change $\Delta n$ but dependent on the quantity $\Delta R$ referred to the ring diameter $R_0$. The value $\Delta n$ referenced 21 for the frequency $f_1$ and the gain g on the circular path $R_0 \pm b$ can be transferred from the graph of FIG. 5 into the illustration of FIG. 6. The two values 121 and 221 derive for the diameters $R_0 - b$ and $R_0 + b$, namely with the value $-\Delta n$ from FIG. 5. In corresponding fashion, the values 122 and 222 in FIG. 6 are obtained for this frequency $f_1$ and the parameter g ($R_0 \pm a$) proceeding from the value 22 in FIG. 5. The corresponding value 23 for the frequency $f_1$ of the parameter g($R_0$) transforms into the value 123 in FIG. 6 that is the maximum of the (negative) refractive index change $\Delta n$ for the frequency $f_1$.

In the illustration of FIG. 6, the values 131, 231 for the frequency $f_2$ and the parameter values g($R_0 \pm b$) are analogously obtained. The analogous case applies to the transfer of the values 32 and 33 from FIG. 5 into the corresponding values 132 and 232, as well as the value 133 in FIG. 6.

As may be seen from FIG. 6, a radius-dependent refractive index change that corresponds to the curve 121, 122, 123 in the third quadrant drives for a laser frequency $f_1$. This curve 125 indicates that, for the frequency $f_1$ below $f_0$, the refractive index n below the value $R_0$ becomes smaller with increasing diameter R. For the frequency $f_2$ higher than $f_0$, the curve 135 in the first quadrant shows that decreasing behavior for the refractive index n is likewise present for increasing radius R above the value $R_0$. This behavior is the above-discussed necessity (Equation 1) for phase-guided circulation of laser emission to have an annular path wherein propagation of the emission free of Tscherenkow radiation occurs across the cross-section of the ring that has a finite dimension. As may be seen from FIGS. 2, 3 and 5, the dependency $\Delta n$ ($\Delta R$) shown in FIG. 6 can be achieved that allows an at least largely approximated dependency of the curve of refractive index to be achieved according to $-1/R$ in the quadrants 3 and 1, namely, that satisfies the above-recited equation (1).

Equation (3) is available for calculating the frequency tuning for a ring laser of the invention having a curvature radius R prescribed, namely, by the fashioning of the electrode 14 of FIG. 1.

$$R = \frac{-n}{dn/dR} = -\frac{4\pi\eta(1 + I/I_0)}{\lambda(dg/dR)} - \frac{1 + \phi^2}{\phi} \quad (3)$$

It is assumed for the applicability of this equation that the intensity ratio $I/I_0$ (see Equation (2)) is extremely small, i.e. operation at an emission intensity ensues significantly below the value of the saturation intensity $I_0$.

The quantity $\phi$ is the frequency shift of the frequency f compared to the frequency $f_0$ expressed in the unit of measurement $\Delta f/2$. Valid is $$f = f_0 + \phi(\Delta f/2)$$

Also valid in accord with the above statements is:

$$dg/dR = G\cdot \bar{j}$$

Figure 7:
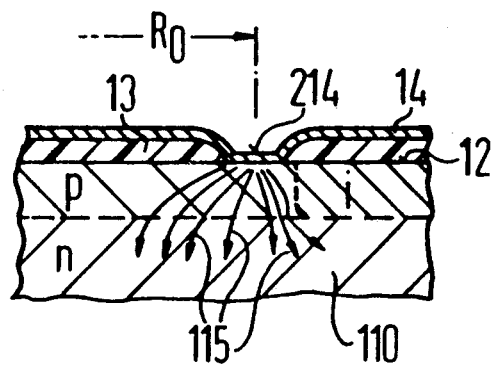
FIG. 7 is a cross section of a semiconductor ring laser showing non-uniform current density distribution.

The quantity $\phi$ indicates how far the actual frequency f lies from the center frequency $f_0$ of the laser diode. The factor G is a geometry factor that is dependent on the distance D of the pn-junction from the surface 12 of the semiconductor body 10, on the width B of the annular strip 214 of the electrode 14 lying on the semiconductor surface 12 and on the conductivity of the semiconductor material. It has been found that the factor G is nearly constant (independently of R or slightly focussing) and that this can be expressed with the equation $G = G_0 - \beta \cdot R$ wherein $\beta$ is greater than 0 The quantity G can also be influenced in such fashion that adapted current density distribution 115 is produced by non-uniform conductivity distribution in the semiconductor body, as is graphically set forth with reference to FIG. 7. The semiconductor region referenced i in the semiconductor body 110 in FIG. 7 is rendered high-impedance. In this embodiment, the inventive generation of annularly circulating laser emission is limited to the region $-\Delta R$.

The quantity $\bar{j}$ is the mean current density that is proportional to the overall injection current. Following from the equation $$\frac{dR}{R} = \frac{dR \cdot \delta f}{df \cdot R} + \frac{dR \cdot \delta \bar{j}}{d\bar{j} \cdot R} = 0 \quad A$$

is the equation $$\frac{df}{\Delta f/2} = \phi \frac{\phi^2 + 1}{\phi^2 - 1} - \frac{\delta \bar{j}}{\bar{j}} = \eta \frac{\delta \bar{j}}{\bar{j}} \quad B$$

The following value pairs can be recited for the quantities $\phi$ and $\eta$

| $-\infty$ | $-2$ | $-1$ | $-1/2$ | $0$ | $1/2$ | $1$ | $2$ | $\infty$ |
|---|---|---|---|---|---|---|---|---|
| $-\infty$ | $-10/3$ | $-\infty$ | $5/6$ | $0$ | $-5/6$ | $\infty$ | $10/3$ | $\infty$ |

As may be seen given knowledge of the invention, no frequency variation can be achieved from these value pairs for $f = f_0$, i.e. for $\phi = 0$, namely because the value $\Delta n = 0$ applies for $f_0$, as may be seen from FIGS. 2, 3, 5 and 6. The minimum radii, however, derive given a value $f = f_0 \pm \Delta f/2$, i.e. given $\phi = \pm 1$. As may be seen, a great sensitivity or, respectively, a great range of tunability derive therefrom.

In the region of the extreme values of n (f), the value $\eta$ lies at approximately 1, i.e. $\delta f/\Delta f/2$ is approximately equal to $\delta \bar{j}/\bar{j}$. It may be seen therefrom that the size of the frequency variation is approximately equal to the product of half the bandwidth ($\Delta f/2$) and the relative current change. This provides a person skilled in the art with the tuning possibilities he should apply.

The teaching of the invention and the employment thereof shall be additionally set forth below with reference to an example.

The bandwidths of a ring laser of the invention lie at a few 100 cm$^{-1}$. For a (half) bandwidth of, for example, $\Delta f/2$ approximately equal to 2 THz and a bandwidth of 20 GHz of a transmission channel in the GHz range (for example 2.4 Gbs), the bandwidth of such a transmission channel can be entirely frequency-varied with a 0.1% change of the injection current. Given this frequency-variation, the curvature radius of this ring laser remains rigidly prescribed according to the annular contact 214 of the laser diode. In the afore-mentioned example, thus, the radius is permanently maintained and the frequency of the generated laser emission can be varied in the correspondingly recited range with the assistance of a change in the size of the injection current.

Figure 8:
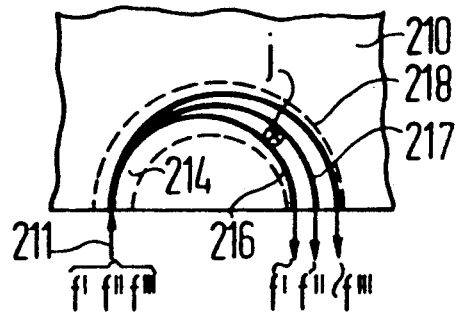
FIG. 8 is a plan view of differing arcuate paths of laser radiation of different frequencies in a ring laser.

Given, conversely, a constant injection current, what can be achieved is that radiation beamed into an arrangement of the invention proceeds on (circular) arcs of different sizes in the semiconductor material dependent on different frequency (lying within the corresponding bandwidth). FIG. 8 shows how radiation beamed in the direction 211 at a location of the semiconductor body 210 proceeds—dependent on the frequency thereof—in arcs 216, 217, 218 of different sizes in the semiconductor material 210 pumped by current injection and in turn emerges at locations of this semiconductor body that are different in frequency-dependent fashion. A spatial separation of the radiation of different channels is possible in this fashion. Given, for example, a frequency multiplex transmission with 1% distance of the individual channels from one another, a fanning of the circular arcs of the radiation courses in the semiconductor material that has a respective, 1% different curvature radius from channel to channel can be achieved. The spatial separation of channel from channel then corresponds to a respective spacing of 0.02 R.

Figure 9:
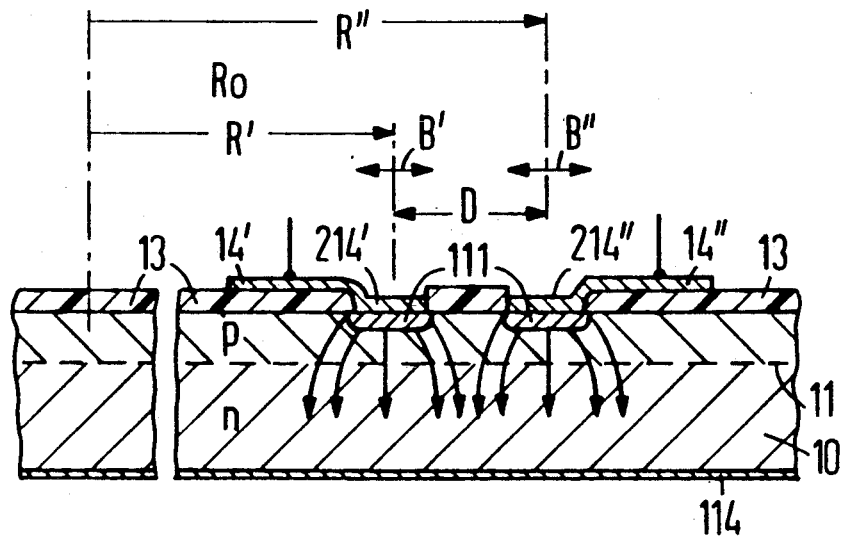
FIG. 9 is a cross section of an alternate embodiment of the ring laser of the present invention having two arcuate electrodes.

FIG. 9 shows an alternative or, respectively, further development of the idea of the invention with which the active diameter of the ring that generates the laser emission or, respectively, the location of the annular or, respectively, at least arcuate generation of laser emission can be set.

In FIG. 9, two annular electrodes arranged coaxially with one another are referenced 14' and 14''. These can also be arcuate (sector) segments of such concentric rings. Individually, they correspond to the electrode 14 of FIG. 1. They have electrical contact to the surface 12 of the semiconductor body 10 with the annular strips 214' or, respectively, 214'' having the width dimensions B' and B''. D is the distance of the two annular strips from one another. 13 references an insulating layer 13 (repeatedly interrupted in annular fashion), as present in FIG. 1. (p+) contact regions that are additionally provided here are referenced 111, these managing good ohmic contact in the semiconductor material to the electrodes 14', 14'' in the strip regions 214', 214''.

Figure 10:
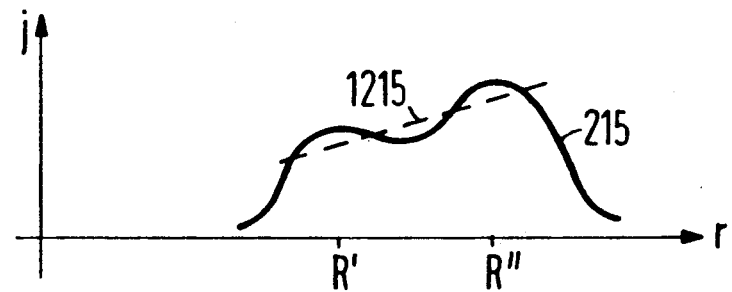
FIG. 10 is a graph of current density distribution of the two arcuate electrodes of FIG. 9.

The electrodes 14' and 14'' can be supplied with electrical current separately from one another. Dependent on B', B'' and D as parameters, a resultant current density distribution 215 in the plane of the pn-junction 11 of this "double ring structure" 14', 14'' can be achieved by the relationship of the currents (current densities j' and j'') to one another. FIG. 10 shows this. The broken line 1215 is a linear approximation to the current density distribution 215 that is valid for the relevant diameter range. A controllable 1/R decrease of the refractive index derives therefrom, namely as required for the realization of the invention. Taking the further parameters into consideration, a suitable ring size $R_0$ can thus be set or, respectively, prescribed. The gain can be influenced by setting the values of the currents.

An embodiment of the invention corresponding to the above principle can also have more than two such coaxially arranged electrodes or, respectively, arcuate segments of such electrodes.

Corresponding embodiments can also be employed for optical pumping. Surface regions of the surface of the laser-active material that are essentially the same in shape and, potentially, the same in area as well in which this material is charged with the pump radiation replace the electrodes 14', 14" therein. The irradiation intensities of the annular or, respectively, arcuate regions that are to be controllably set then replace the currents or, respectively, current densities.

Figure 11:
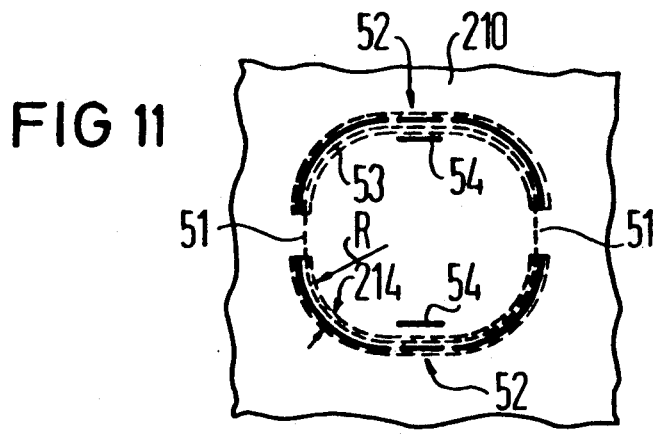
FIG. 11 is a plan view of an arcuate path laser according to the present invention having inserted sections and inserted elements for modulating, intensifying, focussing and defocussing, for example, the laser radiation of the ring laser.

In addition to the inventive, arcuate course of a radiation free of Tscherenkow Radiation, for example in the pumped semiconductor material, defocussing and, connected therewith absorbent sections 51 and/or focussing and, connected therewith, intensifying elements 52 can also be inserted into the beam course as parts of an entire circulation ring. FIG. 11 shows such a circulation ring comprising the two inserted sections 51 and two inserted elements 52. The path 53 of the beam circulation is shown with broken lines in FIG. 11. The elements 52 each have a respective modulation electrode 54 attached to them, these being an electrode strip on the surface of the semiconductor material. In the region of an element 52, this electrode 54 is arranged next to the annular electrode 14 or, respectively, its contact strip 214. As may be seen, the defocussing, attenuating section has no part of the otherwise annularly closed injection electrode 14. The circulating radiation can be intensity modulated by modulated current injection with the assistance of the electrode 54.

Figure 12:
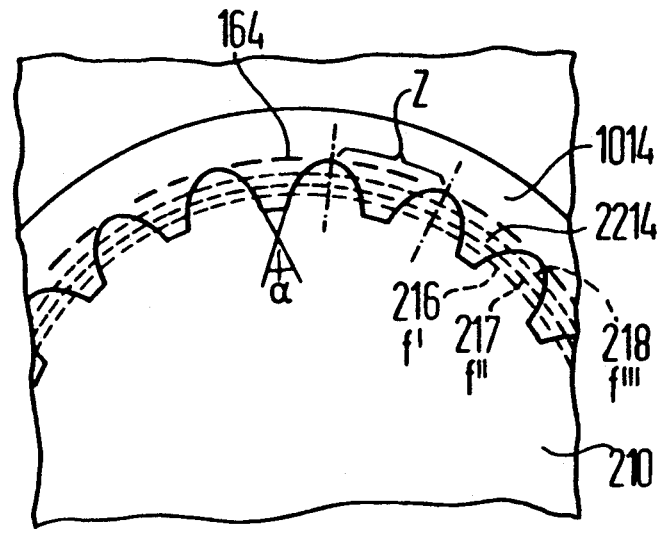
FIG. 12 is a partial plan view of an alternate embodiment of the ring laser of the present invention having a toothed contact.
Figure 13:
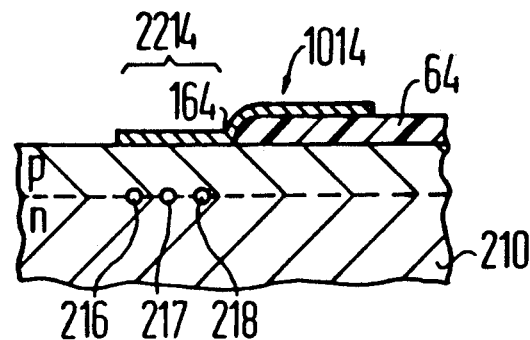
FIG. 13 is a cross section of the embodiment shown in FIG. 12.

FIGS. 12 and 13 show a further development relating to an application of the invention corresponding to FIG. 8. The size of the fanning present in the arrangement of FIG. 8 in the region of the frequency-selective, spatial separation of the radiation of the individual channels encounters a limit based on the fact that the width of the contacting electrode strip 214 on the semiconductor surface cannot be arbitrarily large since the inventively influenced refractive index would otherwise not have a 1/R drop in the region of the pn-junction that would be adequate for the invention. As an estimate, the width of the contacting, annular region 214 that is still permissible lies between the dimension D and D/2, wherein D is the distance of the pn-junction from the contacted semiconductor surface 12 recited in FIG. 1. A further development is comprised therein that the contacting region 214 is lent a zig-zag or, respectively, toothed shape at the inside of the arc, as proceeds from FIG. 12. 216 through 218 reference arcuate courses corresponding to those of FIG. 8. R indicates the radius of the arc, wherein R has the above-recited significance. The "tooth division Z" and the further dimensions are at least approximately dimensioned according to the equation:

$$R = \frac{n \cdot Z}{2 \cdot n \cdot tg\alpha/2}$$

in order to achieve an especially beneficial effect. For example, an arc diameter $R=500$ $\mu m$ derives for a numerical example having the refractive index $n=2$ of the semiconductor material, $Z=10$ $\mu m$, having $\Delta n=0.02$ and the angle $\alpha=90°$.

FIG. 13 serves the purpose of supplementary explanation, this indicating a cross-section through the configuration of FIG. 12. 64 references a layer of electrically insulating material. It may be derived therefrom that the electrode strip 1014 preferably has only the tooth-shaped parts 2214 lying on the surface of the semiconductor material of the semiconductor body 210.

Viewed strictly, the radiation paths 216, 217, 218 do not proceed exactly arcuately; rather, essentially straight-line sections are present between the teeth 2214. Consequently, a deflection angle $\epsilon$ of the radiation is present from one tooth to the neighboring tooth, whereby this angle is $$\epsilon = 2(\Delta n/n) \cdot tg\, \alpha/2,$$

less than $0.04\, tg\, \alpha/2$.

A further development of this embodiment relating to an application of the invention is comprised in lending the sidewalls of the teeth 2214 a slight curvature, an advantageous light focussing being capable of being therewith achieved.

Let it also be noted regarding the aforementioned numerical example that, due to the electron density effect that leads to the values $\Delta n$, this embodiment of an employment of the invention can also be employed for a semiconductor laser wherein the radiation runs in the line middle.

Figure 14:
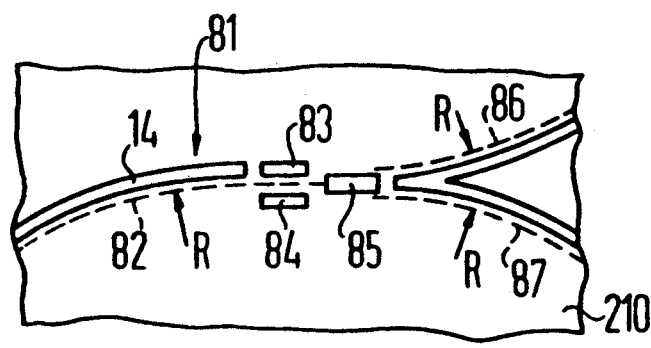
FIG. 14 is a partial plan view of a separating filter of a laser radiation path according to the present invention.

FIG. 14 shows a development of a separating filter for the radiation course based on the employment of the invention. 81 references an arc segment to which a strip-shaped electrode 214 as described in FIG. 1 belongs. R references the radius of the path 82 of an inventive beam course. 83 and 84 reference electrode sections that, as may be seen from FIG. 14, are arranged side-by-side at both sides of the path 82. By dividing the current injection onto the electrode sections 83 and 84, a controllable influencing of the position of the path 82 between these two electrode sections 83 and 84 can be achieved. 85 references an auxiliary electrode. A controllable displacement of the path 82 into the respectively further path section 86 or 87 can be achieved with the assistance of the electrodes 83, 84 and 85. For example, these paths 86 and 87 again have the same curvature R, but the curvature radii of the paths 86 and 87 proceed in directions different from one another. The radiation proceeds on the paths 86 and 87 in the inventive way. The radius R, for example, amounts to 150 $\mu m$ and the length of the electrode 85 amounts to 10 $\mu m$ given a width of about 2 $\mu m$. The electrode sections 83 and 84 have approximately the same dimension as the electrode 85 and their distance from one another amounts to about 12 $\mu m$.

Figure 15:
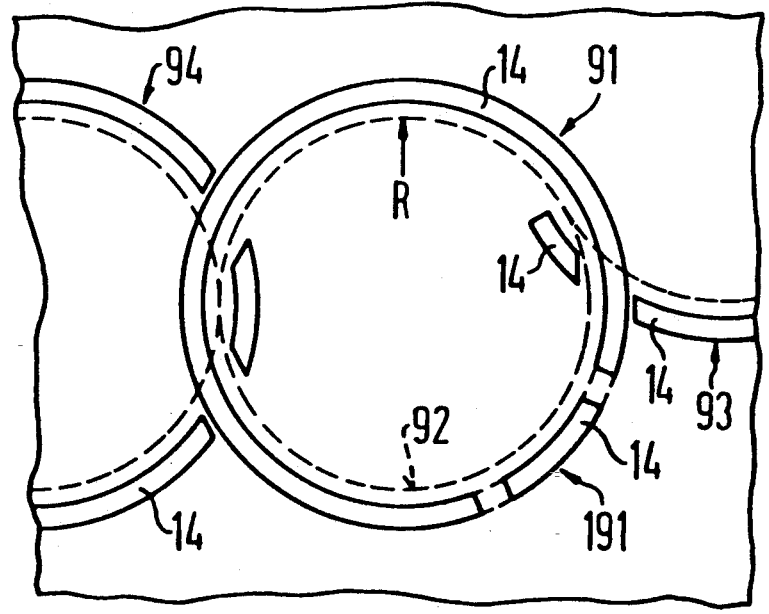
FIG. 15 is a plan view of a ring laser of the present invention having means for in-coupling and out-coupling.

FIG. 15 shows an application of the invention and, therein, embodiments for in-coupling and out-coupling of inventively generated radiation. FIG. 15 shows a plan view onto a semiconductor body having an annular electrode 14 that is executed in detail as recited in FIG. 1. The entire ring of this ring laser in the embodiment of FIG. 15 is referenced 91. This ring 91 contains a section 919 with whose assistance a control or, respectively, modulation of the radiation gain in the ring 91 can be effected by controlling the current injection. 92 references the appertaining path of the inventively phase-guided, circulating radiation.

93 and 94 reference sections of the in-coupling or, respectively, out-coupling paths. These intersect the ring with an in-coupling or, respectively, out-coupling effect, as is already known for laser diode arrangements having a straight-line radiation propagation. A control or, respectively, modulation of the in-coupling and/or out-coupling can be carried out by modulation of the current injection for the paths 93 and/or 94.

A plurality of annular paths 91, 94 . . . can be provided on such a semiconductor body for multiplex operation. The frequency of the laser emission generated in the respective ring can be fine-tuned with the respective injection current for every individual ring.

Such path sections 93, 94 and/or the ring 91 or, respectively, the ring part 191 thereof can also serve as transmitter or detector segments for the laser emission generated in the ring of the laser diode.

As a result of its semiconductor structure, a ring laser diode of the invention is suitable for integration with IC circuits that serve for the allocated signal processing.

Index guidance on the basis of provided layer sequences in the fashion of the double hetero layer structure as well, as known for laser diodes can also be additionally provided in all embodiments and applied examples having inventive phase guidance of the radiation.

Although other modifications and changes may be suggested by those skilled in the art, it is the intention of the inventor to embody within the patent warranted hereon all changes and modifications as reasonably and properly come within the scope of his contribution to the art.

I claim:

1. A method for operating a light amplifier having an at least arcuately guided radiation path in a laser-active material of the light amplifier, said light amplifier having an at least arcuate pump zone to which energy is supplied to excite laser energy in said radiation path by optical pump action, said pump zone being of a width provided on a surface of the laser-active material, said optical pump action of said light amplifier exciting the laser energy at a depth in the laser-active material, wherein a distribution profile of said pump action is present in said light amplifier with reference to the radiation path and a gradient of the distribution profile of the pump action effects a gradient of the refractive index of the laser-active material dependent thereon and a gain maximum for exciting laser energy lies at a radiation frequency $f_0$, the method comprising the steps of:
    generating a phase-guided laser radiation in said light amplifier having a self-adjusted frequency in a range of $f_{1,2}=f_0\pm\Delta f$ given a gain that is smaller than the maximum gain and given adaptation for the width and for the depth,
    allowing said phase-guided laser radiation having said self-adjusted frequency to circulate in a self-adjusted radius region for said self-adjusted frequency in which a refractive index range $n(R)=n_0\pm\Delta n$ modified by the pump action has a curve of refractive index at least approximated to $(-1/R)$ where R is a radius of curvature of a radiation path of the laser radiation, whereby the appearance of radiation analogous to Tscherenkow radiation is avoided on this radiation path; and
    optically pumping the laser active material along an arcuate irradiation strip.

2. A method for operating a light amplifier according to claim 1, further comprising the step of: providing two coaxially positioned at least arcuately shaped irradiation regions on the surface of the laser-active material.

3. A method for operating a light amplifier having an at least arcuately guided radiation path in a laser-active material of the light amplifier, said light amplifier having an at least arcuate pump zone to which energy is supplied to excite laser energy in said radiation path, said pump zone being of a width provided on a surface of the laser-active material, said light amplifier exciting the laser energy at a depth in the laser-active material by pump action, wherein a distribution profile of the pump action is present in said light amplifier with reference to the radiation path, and a gradient of the distribution profile of the laser energy effects a gradient of the refractive index of the laser-active material dependent thereon, and a gain maximum for exciting laser energy lies at a radiation frequency $f_0$, the method comprising the steps of:
    generating a phase-guided laser radiation in said light amplifier having a self-adjusted frequency in a range of $f_{1,2}=f_0\pm\Delta f$ given a gain that is smaller than the maximum gain and given adaptation for the width and for the depth,
    allowing said phase-guided laser radiation having said self-adjusted frequency to circulate in a self-adjusted radius region for the radiation frequency $f_0$ in which a refractive index range $n(R)=n_0\pm\Delta n$ modified by the pump action has a curve of refractive index at least approximated to $(-1/R)$ where R is a radius of curvature of a radiation path of the laser radiation, whereby the appearance of radiation analogous to Tscherenkow radiation is avoided on this radiation path; and
    injecting current into a semiconductor material of the light amplifier along an arcuate electrode strip, whereby the laser energy is controlled by the current.

4. A method according to claim 1, wherein said at least arcuate radiation path is of a locally constant radius.

5. A method of operating a light amplifier according to claim 3, further comprising the step of: separately supplying current via two coaxially arranged at least arcuate electrodes for separate current supply.

6. A method for operating a light amplifier according to claim 3, further comprising the step of:
    providing a toothed injection electrode.

7. A method for operation a light amplifier according to claims 1 or 3, further comprising the step of:
    providing control, modulation and/or evaluation electronics on an integrated semiconductor structure for said light amplifier.

8. A method for operating a light amplifier according to claim 1 or 3, further comprising the step of:
    utilizing said light amplifier as a multiplexer and/or demultiplexer.

9. A method as claimed in claims 1 or 3, further comprising the step of:
    employing said light amplifier for control of the path direction and/or as separating filter for the path direction.

10. A method according to claim 3, wherein said at least arcuate radiation path is of a locally constant radius.

* * * * *